United States Patent
Liu

(10) Patent No.: US 9,216,898 B2
(45) Date of Patent: Dec. 22, 2015

(54) CHIP PACKAGE AND METHOD FOR FORMING THE SAME

(76) Inventor: Chien-Hung Liu, New Taipei (TW)

( * ) Notice: Subject to any disclaimer, the term of this patent is extended or adjusted under 35 U.S.C. 154(b) by 441 days.

(21) Appl. No.: 13/467,814

(22) Filed: May 9, 2012

(65) Prior Publication Data

US 2012/0286420 A1 Nov. 15, 2012

Related U.S. Application Data

(60) Provisional application No. 61/484,074, filed on May 9, 2011.

(51) Int. Cl.
| | | |
|---|---|---|
| H01L 23/48 | (2006.01) | |
| H01L 23/52 | (2006.01) | |
| H01L 23/40 | (2006.01) | |
| B81B 7/00 | (2006.01) | |
| H01L 21/78 | (2006.01) | |
| H01L 23/00 | (2006.01) | |
| H01L 25/065 | (2006.01) | |

(52) U.S. Cl.
CPC ............... *B81B 7/007* (2013.01); *H01L 21/78* (2013.01); *H01L 24/19* (2013.01); *H01L 24/20* (2013.01); *B81C 2203/0792* (2013.01); *H01L 24/13* (2013.01); *H01L 24/29* (2013.01); *H01L 24/32* (2013.01); *H01L 25/0657* (2013.01); *H01L 2224/10156* (2013.01); *H01L 2224/12105* (2013.01); *H01L 2224/16147* (2013.01); *H01L 2224/215* (2013.01); *H01L 2224/2919* (2013.01); *H01L 2224/29186* (2013.01); *H01L 2224/32145* (2013.01); *H01L 2224/81191* (2013.01); *H01L 2224/8385* (2013.01); *H01L 2225/06513* (2013.01); *H01L 2924/01029* (2013.01); *H01L 2924/12041* (2013.01); *H01L 2924/13091* (2013.01); *H01L 2924/1461* (2013.01)

(58) Field of Classification Search
USPC .......................................... 257/737; 438/458
See application file for complete search history.

(56) References Cited

U.S. PATENT DOCUMENTS

| | | | |
|---|---|---|---|
| 2004/0248330 A1 | 12/2004 | Kitabatake et al. | |
| 2005/0056903 A1* | 3/2005 | Yamamoto et al. | 257/433 |
| 2006/0079019 A1* | 4/2006 | Kim | 438/106 |
| 2008/0007934 A1* | 1/2008 | Liu | H01L 23/3114 361/818 |
| 2009/0186449 A1 | 7/2009 | Wang et al. | |

FOREIGN PATENT DOCUMENTS

CN 101859733 10/2010

* cited by examiner

*Primary Examiner* — Marc Armand
*Assistant Examiner* — Wilner Jean Baptiste
(74) *Attorney, Agent, or Firm* — Liu & Liu

(57) ABSTRACT

An embodiment of the invention provides a chip package which includes: a first substrate; a second substrate disposed on the first substrate, wherein the second substrate has at least one opening penetrating through the second substrate, and the at least one opening defines a plurality of conducting regions electrically insulated from each other in the second substrate; a carrier substrate disposed on the second substrate; an insulating layer disposed on a surface and a sidewall of the carrier substrate, wherein the insulating layer fills the at least one opening of the second substrate; and a conducting layer disposed on the insulating layer on the carrier substrate and electrically contacting with one of the conducting regions.

21 Claims, 7 Drawing Sheets

CHIP PACKAGE AND METHOD FOR FORMING THE SAME

CROSS REFERENCE TO RELATED APPLICATIONS

This Application claims the benefit of U.S. Provisional Application No. 61/484,074, filed on May 09, 2011, the entirety of which is incorporated by reference herein.

BACKGROUND OF THE INVENTION

1. Field of the Invention

The invention relates to a chip package, and in particular relates to MEMS chip packages.

2. Description of the Related Art

Along with trends towards light, thin, short, and small electronic devices, semiconductor chip package structures accordingly have tended to be multi-chip package (MCP) structures to achieve requirements of being multi-functional and having high performance. Multi-chip package structures integrate a variety of semiconductor chips, such as logic chips, analog chips, control chips, or memory chips, in a single package substrate.

Different chips may be electrically connected to each other through bonding wires. However, with an increased number of chips being integrated together, connecting the multi-chips through bonding wires results in the phenomena where the size of the package can not be effectively reduced, and too much area is occupied. Fabrication cost is accordingly increased, which does not favor applications of portable electronic products.

BRIEF SUMMARY OF THE INVENTION

An embodiment of the invention provides a chip package which includes: a first substrate; a second substrate disposed on the first substrate, wherein the second substrate has at least one opening penetrating through the second substrate, and the at least one opening defines a plurality of conducting regions electrically insulated from each other in the second substrate; a carrier substrate disposed on the second substrate; an insulating layer disposed on a surface and a sidewall of the carrier substrate, wherein the insulating layer fills the at least one opening of the second substrate; and a conducting layer disposed on the insulating layer on the carrier substrate and electrically contacting with one of the conducting regions.

An embodiment of the invention provides a method for forming a chip package which includes: providing a first substrate; disposing a second substrate on the first substrate, wherein the second substrate has at least one opening penetrating through the second substrate, and the at least one opening defines a plurality of conducting regions electrically insulated from each other in the second substrate; disposing a carrier substrate on the second substrate; partially removing the carrier substrate to form at least one trench exposing the at least one opening and the conducting regions of the second substrate; forming an insulating layer on the carrier substrate, wherein the insulating layer extends on a side wall of the at least one trench and fills the at least one opening of the second substrate; and forming a conducting layer on the insulating layer, wherein the conducting layer electrically contacts with one of the conducting regions.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
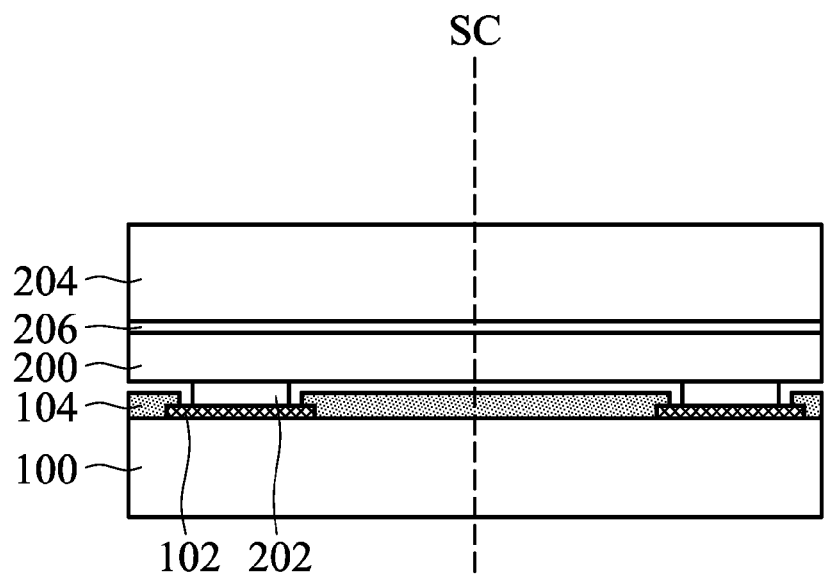
FIGS. 1A-1L are cross-sectional views showing the steps of forming a chip package according to an embodiment of the present invention.

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a variety of stacked chips. For example, the chip package of the embodiments of the invention may be applied to the package structure of the stack of the following illustrated chips which include, for example, active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power MOSFET modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, the diced package is a chip scale package (CSP). The size of the chip scale package (CSP) may only be slightly larger than the size of the packaged chip. For example, the size of the chip package is not larger than 120% of the size of the packaged chip.

FIGS. 1A-1K are cross-sectional views showing the steps of forming a chip package according to an embodiment of the present invention. In following description, an embodiment adopting a wafer-level packaging process is taken as an example. However, it should be appreciated that embodiments of the invention may also adopt another suitable process other than the wafer-level packaging process.

As shown in FIG. 1A, a substrate 100 is provided. The substrate 100 may be a semiconductor substrate (such as a silicon substrate) or a semiconductor wafer (such as a silicon wafer). Using a semiconductor wafer may facilitate wafer-level packaging processes. Packaging quality may be ensured, and fabrication cost and time may be reduced. In one embodiment, there are a plurality of CMOS devices (not shown) formed in the substrate 100. A plurality of pads 102 are formed on a surface of the substrate 100. These pads 102 are electrically connected to a corresponding CMOS device, respectively. A protection layer 104 may also be formed on the surface of the substrate 100, which may cover the surface of the substrate 100 and have openings exposing the pads 102. The material of the protection layer 104 is, for example, an oxide, nitride, oxynitride, polymer material, or combinations thereof.

As shown in FIG. 1A, a substrate 200 is provided. The substrate 200 may be a semiconductor substrate (such as a silicon substrate) or a semiconductor wafer (such as a silicon wafer). In one embodiment, there are a plurality of CMOS devices (not shown) formed in the substrate 100. In one embodiment, there are a plurality of MEMS devices formed in the substrate 200. An insulating layer 206 and a carrier substrate 204 may be formed on an upper surface of the substrate 200. The material of the insulating layer 206 is, for example, an oxide, nitride, oxynitride, polymer material, or combinations thereof. In one embodiment, the material of the insulating layer 206 is silicon oxide. The carrier substrate 204 may be, for example, a semiconductor substrate such as a silicon wafer. The substrate 200 may be bonded on the substrate 100 through pads 202 on the lower surface. As shown in FIG. 1A, the pad 202 and the pad 102 are bonded to each other. In one embodiment, both the pad 202 and the pad 102 are conducting materials. Thus, the pad 202 and the pad 102 may also form a conducting route between the substrate 100 and the substrate 200. For example, the CMOS device in the substrate 100 and the MEMS device in the substrate 200 may transmit electrical signals to each other through the pad 202 and the pad 102. In one embodiment, a thinning process may be performed to the substrate 100 and the carrier substrate 204, respectively.

In one embodiment, a plurality of predetermined scribe lines define the stacked wafers of the substrate 100 and the substrate 200 into a plurality of regions. After a packaging process and a dicing process are subsequently performed, each of the regions becomes a chip package. In each of the regions of the substrate 200, a plurality of notches (or openings) may be formed which define a plurality of conducting regions in the substrate 200. Each of the conducting regions may be electrically connected to a corresponding pad 202. In one embodiment, the conducting regions are highly-doped regions in the substrate 200.

Figure 1B:
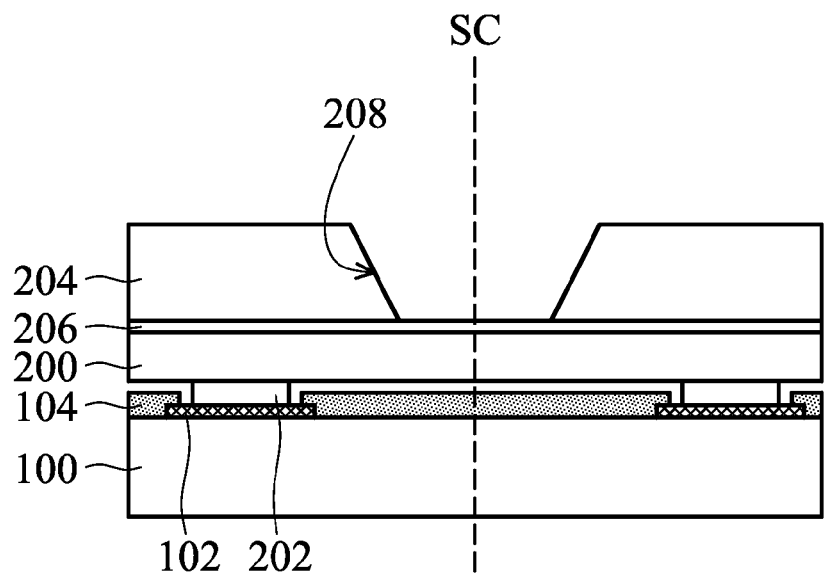

As shown in FIG. 1B, the carrier substrate 204 may be partially removed to form at least one trench 208. The trench 208 may extend substantially along one of the predetermined scribe lines SC. The trench 208 may expose the insulating layer 206. In one embodiment, a photolithography process and an etching process (such as a dry etching process) may be used to form the trench 208.

Figure 2:
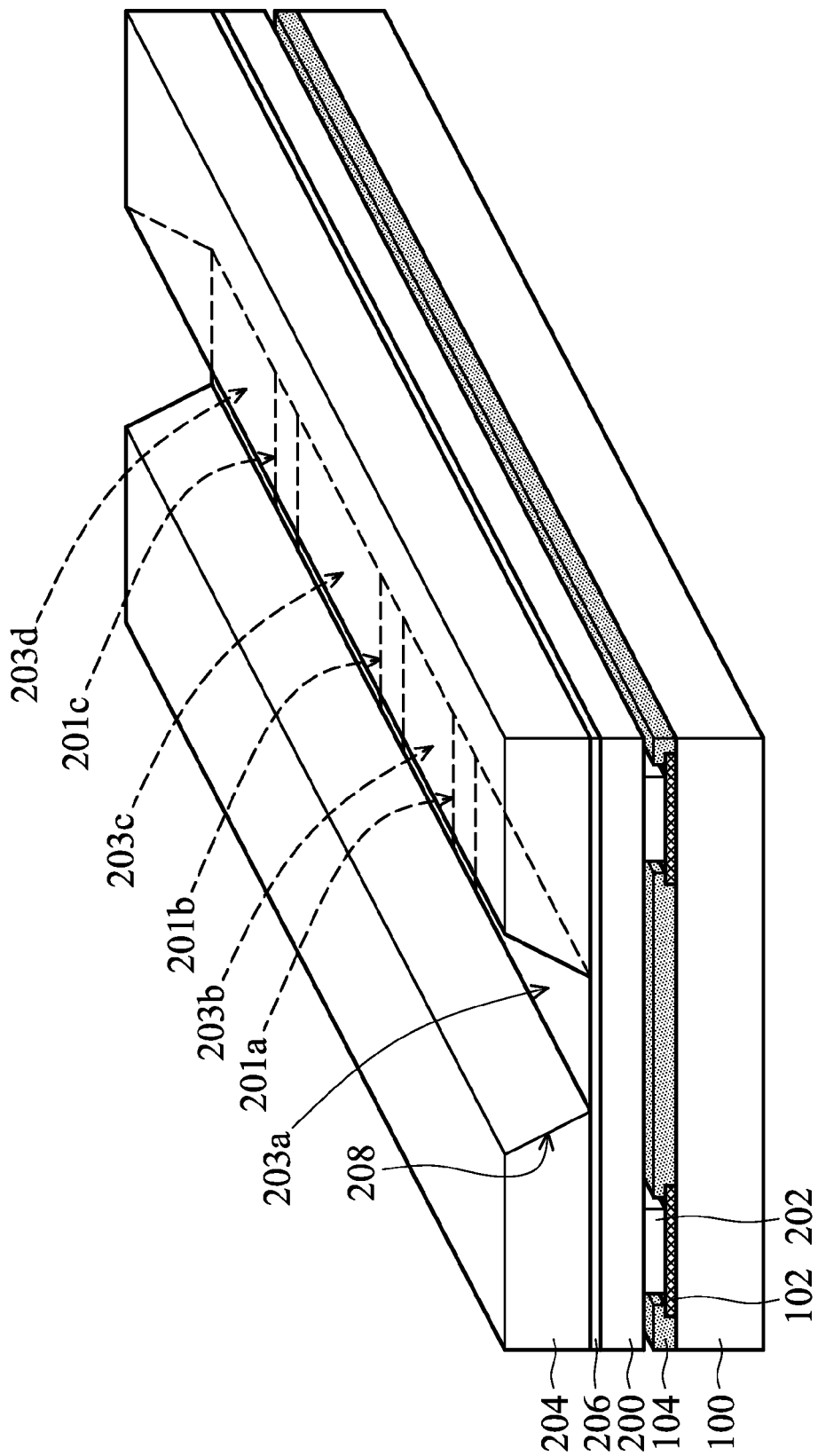
FIG. 2 is a three-dimensional view showing the structure corresponding to that shown in FIG. 1B.

FIG. 2 is a three-dimensional view showing the structure corresponding to that shown in FIG. 1B. As shown in FIG. 2, the substrate 200 may have at least one opening under the trench 208, which defines a plurality of conducting regions electrically insulated from each other in the substrate 200. In one embodiment, a plurality of openings 201a, 201b, and 201c define the substrate 200 under the trench 208 into a plurality of conducting regions 203a, 203b, 203c, and 203d. The conducting regions are electrically insulated from each other due to isolation of the openings. In one embodiment, a plurality of pads may be formed on the lower surface of the substrate 200, and the pads 202 may be disposed along the trench 208 (or along the predetermined scribe line SC). Each of the conducting regions may be electrically connected to a corresponding one of the pads to be electrically connected to a corresponding CMOS device in the substrate 100. For example, in one embodiment, the conducting region 203a may be electrically connected to a corresponding CMOS device in the substrate 100 through the pad 202 and the pad 102 shown in FIG. 2.

Figure 1C:
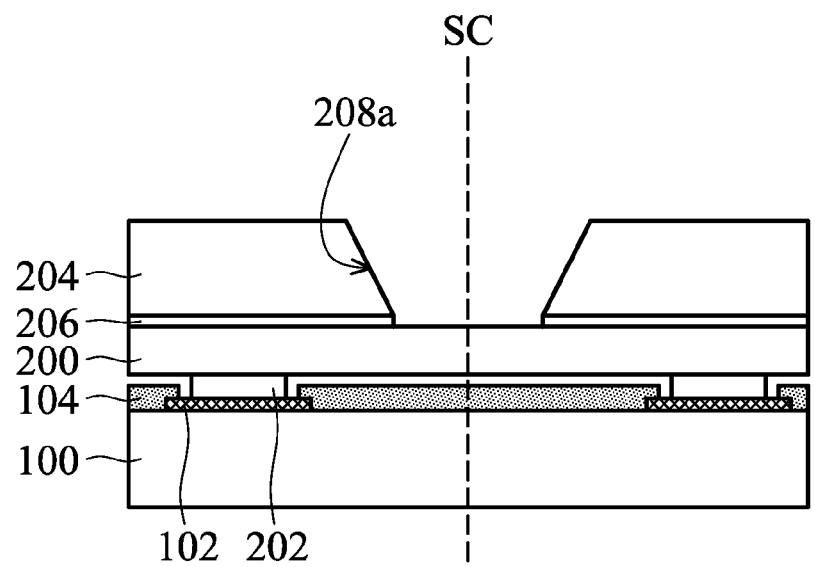

Next, as shown in FIG. 1C, by using, for example, an etching process, a portion of the insulating layer 206 is removed to form a trench 208a exposing the substrate 200. Referring to FIGS. 2 and 1C, the trench 208a may expose the openings penetrating through the substrate 200 and the plurality of conducting regions electrically insulated from each other. For example, the trench 208a may expose the openings 201a, 201b, and 201c and the conducting regions 203a, 203b, 203c, and 203d.

Figure 1D:
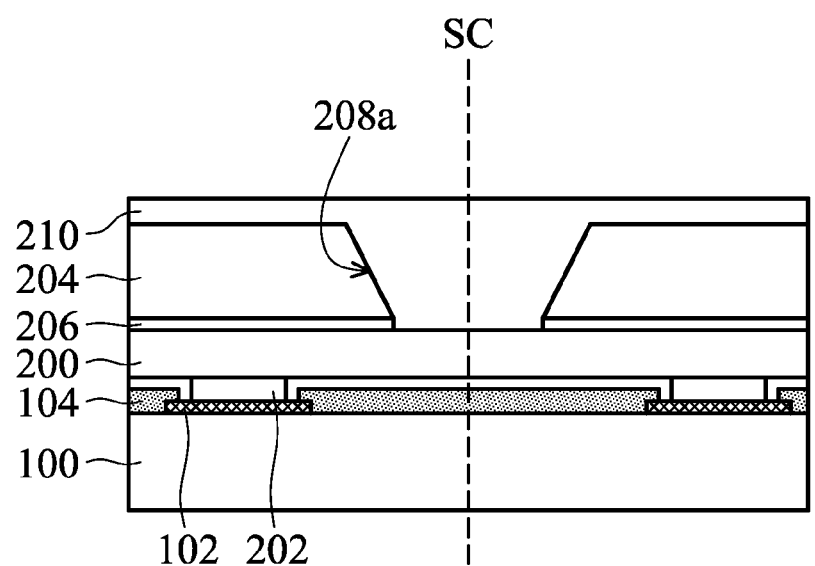

As shown in FIG. 1D, an insulating layer 210 is formed on the carrier substrate 204. The material of the insulating layer 210 may be a polymer material such as an epoxy resin. The insulating layer 210 may also be an oxide, nitride, oxynitride, another suitable polymer material, or combinations thereof. The formation method for the insulating layer 210 is, for example, a coating process, vapor deposition process, spray coating process, or printing process. The insulating layer 210 may fill the trench 208a, and may fill in a gap between the substrate 200 and the substrate 100 through the openings (such as the openings 201a, 201b, and 201c) of the substrate 200. In one embodiment, the insulating layer 210 may only fill and seal the openings (such as the openings 201a, 201b, and 201c) of the substrate 200 without completely filling the gap between the substrate 200 and the substrate 100.

Figure 1E:
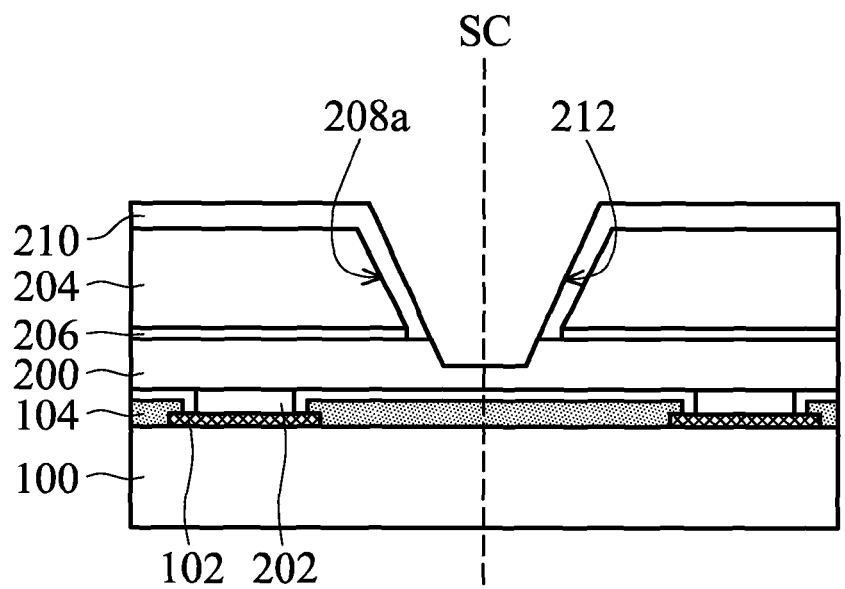

Next, as shown in FIG. 1E, a portion of the insulating layer 210 is removed to form an opening 212 extending from a surface of the insulating layer 210 towards the substrate 200. The opening 212 may be formed by using a dicing process or an etching process. The opening 212 exposes the substrate 200. In one embodiment, the opening 212 may extend into the substrate 200. The opening 212 may be a trench and extend along the trench 208a (or the predetermined scribe line SC). The opening 212 may expose the openings (such as the openings 201a, 201b, and 201c) and the conducting regions (such as the conducting regions 203a, 203b, 203c, and 203d) in the substrate 200, wherein the exposed openings are filled with the previously formed insulating layer 210. In the embodiment where a dicing process is used to form the opening 212, because the previously formed insulating layer 210 has been filled in and the openings (such as the openings 201a, 201b, and 201c) of the substrate 200 have been sealed, particles generated during the dicing process do not fall into the gap between the substrate 200 and the substrate 100 through the openings of the substrate 200, and do not negatively affect the operation of the chip package.

Then, patterned conducting layers may be formed on the carrier substrate 204. The material of the conducting layer may include aluminum, copper, gold, nickel, or combinations thereof. The fabrication method for the conducting layer may include a physical vapor deposition process, chemical vapor deposition process, coating process, electroplating process, electroless plating process, or combinations thereof. Thereafter, by using, for example, an electroplating process, fabrication of the patterned conducting layers of an embodiment may be completed as illustrated.

Figure 1F:
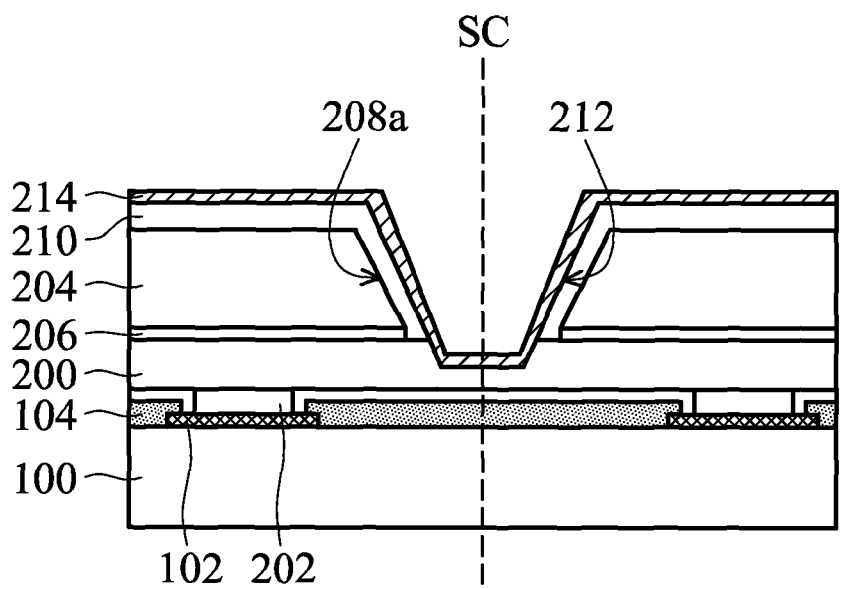

As shown in FIG. 1F, a seed layer 214 is formed on the carrier substrate 204. The material of the seed layer 214 is, for example, aluminum or copper, which may be formed by using, for example, a sputtering process. The seed layer 214 may extend onto the bottom of the opening 212 along the sidewall of the opening 212 and electrically contact with the exposed conducting regions (such as the conducting regions 203a, 203b, 203c, and 203d).

Figure 1G:
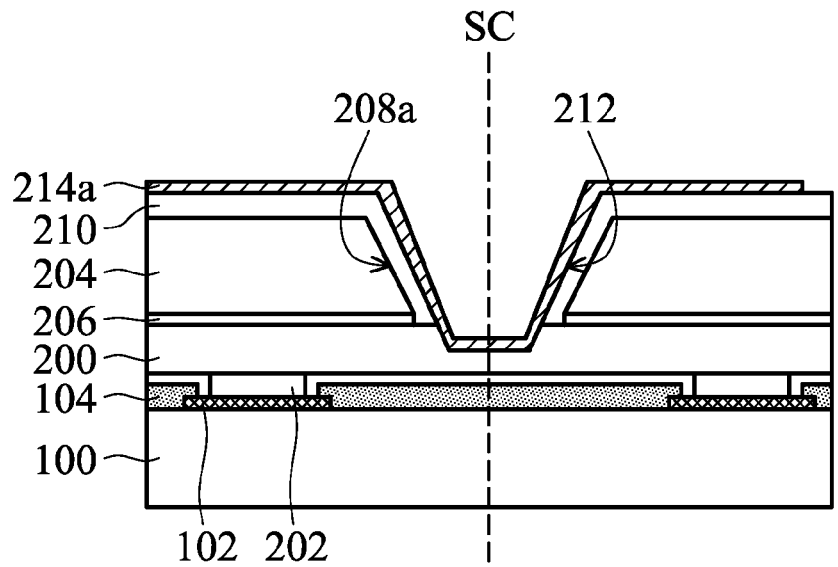

Next, as shown in FIG. 1G, the seed layer 214 is patterned by using, for example, a photolithography process and an etching process to form a patterned seed layer 214a. The patterned seed layer 214a may electrically contact with only one of the conducting regions such as the conducting region 203a. After the seed layer 214 is patterned, other patterned seed layers electrically connecting to other conducting regions (such as the conducting region 203b, 203c, or 203d) may also be formed. Because the previously formed insulating layer 210 has filled in and sealed the openings (such as the openings 201a, 201b, and 201c) at the bottom of the trench 208a of the substrate 200, an etching solution and/or an etching gas, which needs to be used during the patterning process of the seed layer 214, does not reach the pad 202 and the pad 102 through the openings of the substrate 200. Thus, bonding and electrical connections between the substrate 100 and the substrate 200 may be ensured.

Figure 1H:
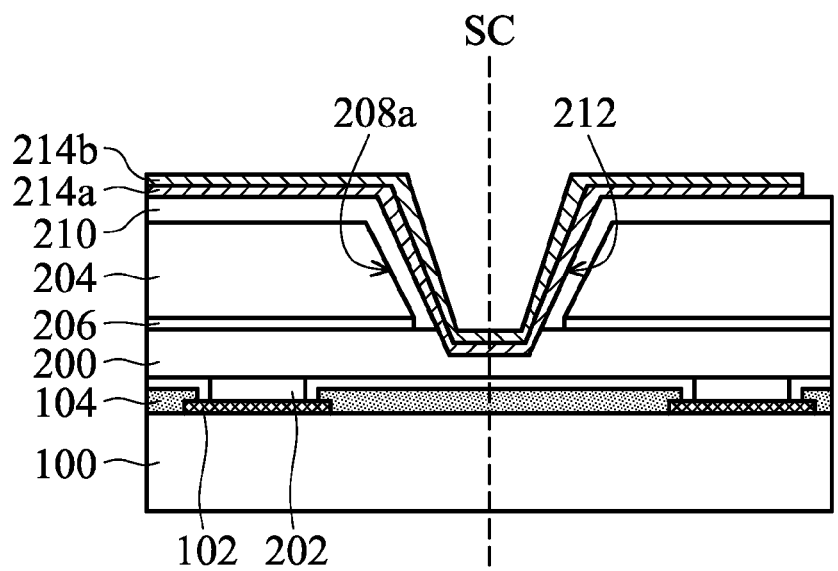

As shown in FIG. 1H, a conducting material may then be electroplated on a surface of the seed layer 214a to form a conducting layer 214b. In one embodiment, the conducting layer 214b may include nickel, gold, copper, or combinations thereof.

Figure 1I:
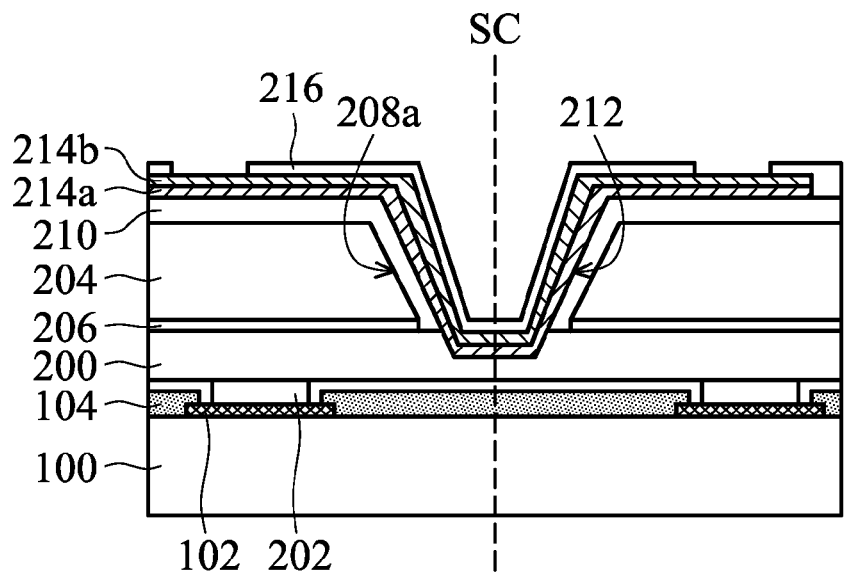
Figure 1J:
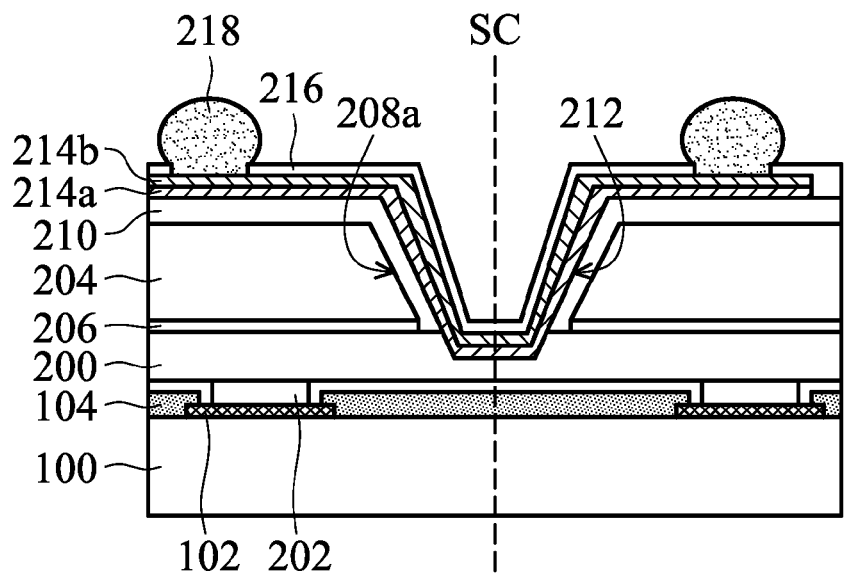

Next, as shown in FIG. 1I, a solder mask layer 216 is formed on the conducting layer 214b. The solder mask layer 216 has openings exposing the conducting layer 214b. As shown in FIG. 1J, conducting bumps 218 may be formed on the conducting layer 214b exposed by the opening.

Figure 1K:
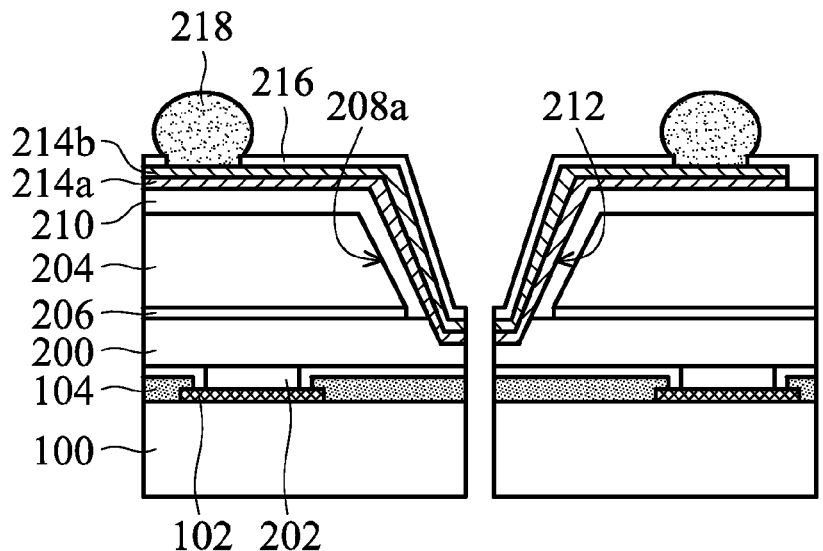
Figure 1L:
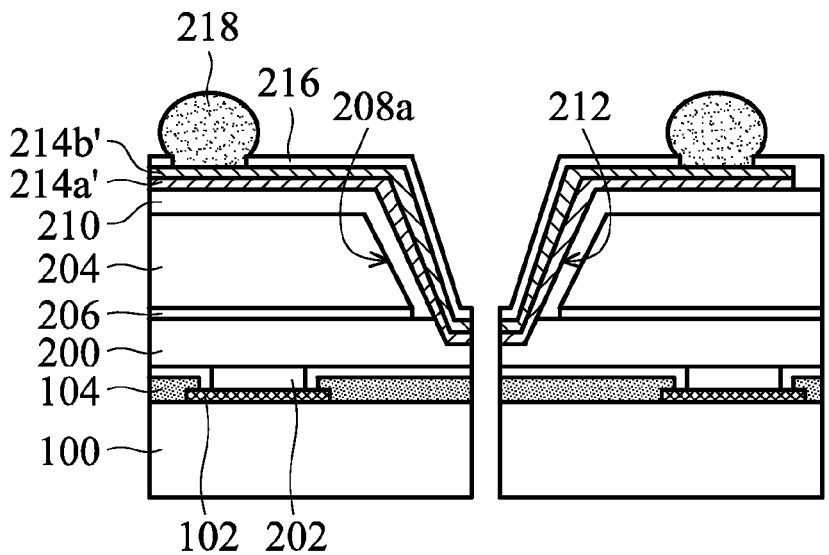

As shown in FIG. 1K, the structure shown in FIG. 1J may be diced along the predetermined scribe line SC to form a plurality of chip packages separated from each other. In one embodiment, the chip package includes: a first substrate 100; a second substrate 200 disposed on the first substrate 100, wherein the second substrate 200 has at least one opening (such as the openings 201a, 201b, and 201c) penetrating through the second substrate 200, and the at least one opening defines a plurality of conducting regions (such as the conducting regions 203b, 203c, and 203d) electrically insulated from each other in the second substrate; a carrier substrate 204 disposed on the second substrate 200; an insulating layer 210 disposed on a surface and a sidewall of the carrier substrate, wherein the insulating layer 210 fills the at least one opening of the second substrate; and a conducting layer (214a and 214b) disposed on the carrier substrate 204 and the insulating layer 210 and electrically contacting with one of the conducting regions. In addition, FIG. 1K is the cross-sectional view of one of the conducting regions, for example, 203a, and FIG. 1L is the cross-sectional view of another one of the conducting region, for example, 203b, wherein the conducting layer (214a and 214b) of the conducting region 203a is not electrically connected to the conducting layer (214a' and 214b') of the conducting region 203b.

Embodiments of the invention may have many variations. For example, when the patterned seed layer 214a is formed, the patterned seed layer 214a on the bottom of the opening 212 may be set to be not in contact with the predetermined scribe line SC such that the subsequently electroplated conducting layer 214b is also not in contact with the predetermined scribe line SC. In other words, by using a patterning process for adjustments, the formed patterned conducting layer may be separated from the predetermined scribe line SC by a distance without directly contacting with the predetermined scribe line SC. In this case, the formed solder mask layer 216 covers a side of the conducting layer at the bottom of the opening 212. In other words, the solder mask layer 216 covers a side of a portion of the conducting layer near the contacted conducting region. Thus, in the subsequent dicing process, the dicing blade does not cut the patterned conducting layer. Damage, such as peeling of the conducting layer due to the dicing process may be prevented. In addition, the solder mask layer 216 covers the side of the conducting layer, which may prevent oxidation or damage of the conducting layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
a first substrate;
a second substrate disposed on the first substrate, wherein the second substrate has at least one opening penetrating through the second substrate, and the at least one opening defines a plurality of conducting regions electrically insulated from each other in the second substrate, wherein the at least one opening and the conducting regions are arranged alternatively;
a carrier substrate disposed on the second substrate;
an insulating layer disposed on a surface and a sidewall of the carrier substrate, wherein the insulating layer fills the at least one opening of the second substrate; and
a conducting layer disposed on the insulating layer on the carrier substrate and electrically contacting with one of the conducting regions.

2. The chip package as claimed in claim 1, wherein the conducting layer extends from the insulating layer on the surface of the carrier substrate towards the second substrate along the sidewall of the carrier substrate.

3. The chip package as claimed in claim 1, further comprising:
a solder mask layer disposed on the conducting layer, wherein the solder mask layer has an opening exposing the conducting layer; and
a conducting bump disposed in the opening of the solder mask layer and electrically contacting with the conducting layer.

4. The chip package as claimed in claim 3, wherein the solder mask layer covers a side of a portion of the conducting layer near one of the conducting regions.

5. The chip package as claimed in claim 1, wherein the conducting layer extends into the second substrate.

6. The chip package as claimed in claim 1, further comprising a first pad and a second pad disposed between the first substrate and the second substrate, wherein the second pad is bonded on the first pad and electrically connected to one of the conducting regions.

7. The chip package as claimed in claim 6, wherein a gap is between the first substrate and the second substrate.

8. The chip package as claimed in claim 7, wherein the insulating layer fills the gap.

9. The chip package as claimed in claim 1, wherein the sidewall of the carrier substrate inclines to the surface of the carrier substrate.

10. The chip package as claimed in claim 1, further comprising a second conducting layer disposed on the carrier substrate and the insulating layer and electrically contacting with one of the conducting regions, wherein the second conducting layer is not electrically connected to the conducting layer.

11. The chip package as claimed in claim 1, wherein the at least one opening is located between and separates two adjacent conducting regions.

12. A method for forming a chip package, comprising:
providing a first substrate;
disposing a second substrate on the first substrate, wherein the second substrate has at least one opening penetrating through the second substrate, and the at least one opening defines a plurality of conducting regions electrically insulated from each other in the second substrate, wherein the at least one opening and the conducting regions are arranged alternatively;
disposing a carrier substrate on the second substrate;
partially removing the carrier substrate to form at least one trench exposing the at least one opening and the conducting regions of the second substrate;
forming an insulating layer on the carrier substrate, wherein the insulating layer extends on a side wall of the at least one trench and fills the at least one opening of the second substrate; and
forming a conducting layer on the insulating layer, wherein the conducting layer electrically contacts with one of the conducting regions.

13. The method for forming a chip package as claimed in claim 12, further comprising thinning the carrier substrate before the at least one trench is formed.

14. The method for forming a chip package as claimed in claim 12, further comprising thinning the first substrate.

15. The method for forming a chip package as claimed in claim 12, further comprising:
forming a solder mask layer on the conducting layer, wherein the solder mask layer has an opening exposing the conducting layer; and
forming a conducting bump in the opening of the solder mask layer, wherein the conducting bump electrically contacts with the conducting layer.

16. The method for forming a chip package as claimed in claim 12, further comprising dicing and removing a portion of the insulating layer to form a trench opening in the insulating layer, wherein the trench opening exposes the at least one opening and the conducting regions of the second substrate.

17. The method for forming a chip package as claimed in claim 16, wherein the trench opening extends into the second substrate.

18. The method for forming a chip package as claimed in claim 12, further comprising forming a second conducting layer on the insulating layer, wherein the second conducting layer electrically contacts with one of the conducting regions, and the second conducting layer is not electrically connected to the conducting layer.

19. The method for forming a chip package as claimed in claim 18, wherein the steps of forming the conducting layer and the second conducting layer comprise:
forming a conducting material layer on the insulating layer; and
patterning the conducting material layer to form the conducting layer and the second conducting layer.

20. The method for forming a chip package as claimed in claim 19, further comprising electroplating a conducting material on the conducting layer and the second conducting layer.

21. The method for forming a chip package as claimed in claim 12, further comprising performing a dicing process to a bottom of the at least one trench to form a plurality of chip packages separated from each other.

* * * * *